United States Patent [19]

Minner

[11] 4,429,235

[45] Jan. 31, 1984

[54] INPUT STAGE FOR AN IGNITION CONTROL CIRCUIT

[75] Inventor: Willy Minner, Schwaigern, Fed. Rep. of Germany

[73] Assignee: Telefunken Electronic GmbH, Heilbronn, Fed. Rep. of Germany

[21] Appl. No.: 296,583

[22] Filed: Aug. 27, 1981

[30] Foreign Application Priority Data

Sep. 11, 1980 [DE] Fed. Rep. of Germany ....... 3034176

[51] Int. Cl.[3] ........................ H03K 5/01; H03K 5/153

[52] U.S. Cl. .................................... 307/356; 307/246; 307/261; 307/268; 123/606; 123/609; 123/619

[58] Field of Search ............... 307/246, 362, 260, 261, 307/265, 268, 356; 328/59, 74; 123/606, 609, 123/619

[56] References Cited

U.S. PATENT DOCUMENTS

| | | | |
|---|---|---|---|
| 3,937,193 | 2/1976 | Kim . | |
| 4,043,302 | 8/1977 | Sessions . | |
| 4,082,075 | 4/1978 | Davis | 123/609 |
| 4,163,160 | 7/1979 | Frazee | 307/260 |
| 4,276,860 | 7/1981 | Capurka | 123/609 |

FOREIGN PATENT DOCUMENTS

| | | |
|---|---|---|
| 2454505 | 5/1975 | Fed. Rep. of Germany . |
| 2424896 | 11/1975 | Fed. Rep. of Germany . |
| 2747819 | 4/1979 | Fed. Rep. of Germany . |
| 2904037 | 9/1979 | Fed. Rep. of Germany . |

*Primary Examiner*—John Zazworsky

*Attorney, Agent, or Firm*—Spencer & Frank

[57] ABSTRACT

An input stage for an ignition control circuit is provided for producing an output signal from a comparator which switches the primary current circuit of the ignition coil in dependence on a control signal in which the control signal causes alternate switching of two current multipliers, a first charging current determined by a charging resistance and a second charging current determined by the first current multiplier charges a first capacitor, a third charging current derived from the second charging current charges a second capacitor, a first discharge current determined by a discharging resistance and a second discharge current determined by the second current multiplier discharges the first capacitor, a third discharging current derived from the second charging current discharges the second capacitor and a comparator compares the voltage at the second capacitor with a reference voltage to produce an output signal for switching the primary current of the ignition coil.

6 Claims, 8 Drawing Figures

T
U_IN t
t₀ t₁ t₂ t₀' t₁'
I_L1 t
-I_E1
t_L
t_E t
U_C1
U_C1M
0V t
U_C2
U_REF
0V t
U_OUT
0V t
U_C2
0V t
t₀ t₁ t₂ t₀' t₁'

INPUT STAGE FOR AN IGNITION CONTROL CIRCUIT

BACKGROUND OF THE INVENTION

The invention relates to an input stage of an ignition control circuit for producing an output signal by using a comparator, in which the primary current of an ignition coil is switched on and off by the output signal in dependence on a control signal supplied to the input stage.

These input stages for ignition control circuits are required in particular for ignition of the engines of motorised vehicles. The ignition coil delivers the ignition spark for the engine cylinders under time control. In the past this ignition process was controlled by mechanically actuated electrical contacts but increasingly there has been a change over to using electronic ignition systems which ensure that the ignition coils are only subjected to the charging process during that period of time which is required to build up the ignition energy. As a result there is a considerable saving in energy.

SUMMARY OF THE INVENTION

It is an object of the invention to provide an input stage of an ignition control circuit which is capable of integration and which can produce pulses which so control the beginning of the charging time of an ignition coil that a charge current only flows in the coil during the required minimum period. The pulse triggering the charge current is therefore delivered by the input stage immediately before the moment of ignition.

According to a first aspect of the invention there is provided an input stage for an ignition control circuit for producing an output signal from a comparator which switches the primary current of an ignition coil in dependence on a control signal supplied to the input stage, said input stage comprising first and second current multipliers switchable alternately in response to the control signal, a first capacitor chargeable by a first charging current determined by a charging resistance and a second charging current determined by said first current multiplier and dischargeable by a first discharging current determined by a discharging resistance and a second discharging current determined by said second current multiplier, a second capacitor chargeable by a third charging current derived from said second charging current and dischargeable by a third discharging current derived from said second discharging current and a comparator for comparing the voltage at said second capacitor with a reference voltage to provide an output for switching the primary current of the ignition coil.

According to a second aspect of the invention, there is provided an input stage of an ignition control circuit for producing an output signal by using a comparator, in which the primary current of an ignition coil is switched on and off by the output signal in dependence on a control signal supplied to the input stage, wherein the control signal is supplied to an inverter which alternately switches first and second current multipliers respectively in accordance with the inverted clock pulse of the control signal; a first charging current determined by a charging resistance increased by a second charge current by means of the first current multiplier charges up a first capacitor and a third charge current derived from the second charge current via a first current image, or mirror, circuit charges up a second capacitor; a first dischargre current determined by a discharge resistance increased by a second discharge current by means of the second current multiplier discharges the first capacitor and a third discharge current derived from the second discharge current via a second current image, or mirror, circuit discharges the second capacitor; the voltage at the second capacitor is compared with the reference voltage which is present at a comparator and is controlled directly by the noninverted control signal; and the output signal produced up to the output of the comparator for switching on the ignition coil primary current additionally discharges second capacitor.

BRIEF DESCRIPTION OF THE DRAWINGS

The invention will now be described in greater detail, by way of an example, with reference to the drawings, in which.

Figure 1:
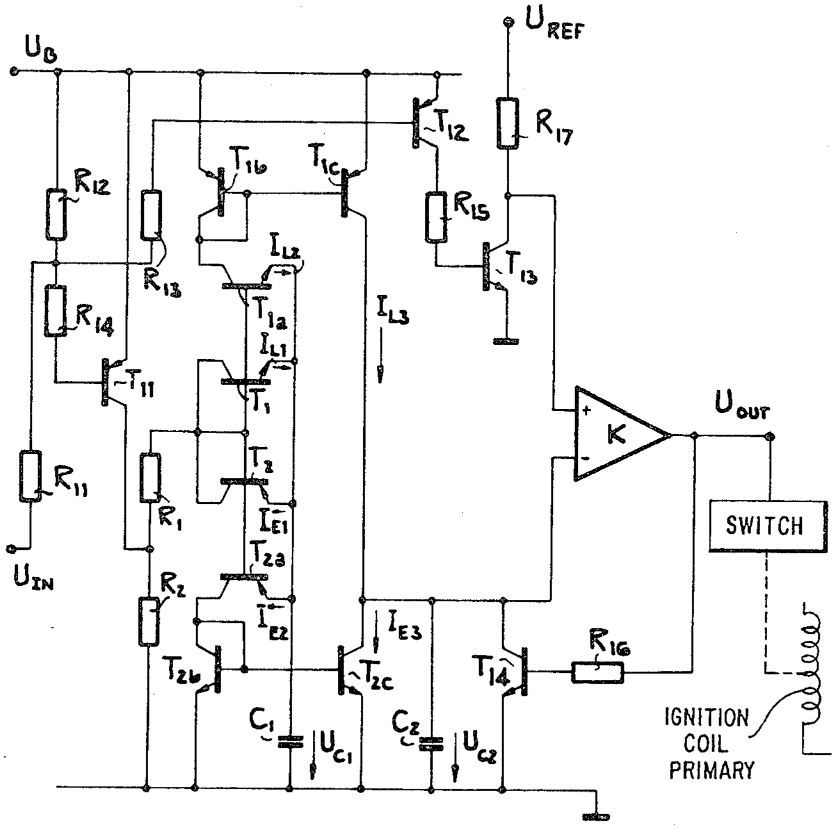
FIG. 1 shows the simplified circuit of the input stage together with its connected comparator.

FIG. *2a* shows the path of the input signal $U_{in}$ of the input stage of FIG. 1.

FIG. *2b* shows the path of the charging current for the first capacitor $C_1$ flowing through the resistor $R_1$ of FIG. 1;

FIG. *2c* shows part of the discharge current of the first capacitor $C_1$ flowing through the voltage divider $R_1+R_2$ of FIG. 1;

FIG. *2d* shows the path of the voltage across first capacitor $C_1$;

FIG. *2e* shows the path of the voltage across capacitor $C_2$ as well as the reference applied to the comparator;

FIG. *2f* shows the output signal at the output of the comparator, and

FIG. *2g* shows the path of the voltage across capacitor $C_2$ while taking into account the feedback loop comprising the resistors $R_{16}$ and the transistor $T_{14}$ between the output of the comparator and one input.

DESCRIPTION OF THE PREFERRED EMBODIMENT

Referring to FIG. 1, basically the desired result is achieved, in accordance with the invention, by supplying the control signal $U_{in}$, which is in the form of a pulse train, to an inverter $T_{11}$ which alternately switches two current multipliers $T_1$, $T_{1a}$ or $T_2$, $T_{2a}$ in accordance with the inverted form of the control signal pulse train, and by making the first charging current $I_{L1}$ determined by a charge resistor $R_1$ charge up a first capacitor $C_1$ increased by a second charging current $I_{L2}$ due to the first current multiplier $T_1$, $T_{1a}$, and by making a third charging current $I_{L3}$ charge up the second capacitor $C_2$, the third charging current being derived from the second charging current $I_{L2}$ via a current image circuit $T_{1b}$, $T_{1c}$, and by making the first discharging current $I_{E1}$ determined by the discharge resistor $R_1+R_2$ discharge the first capacitor $C_1$ increased by a second discharging current $I_{E2}$ due to the second current multiplier $T_2$, $T_{2a}$ and by making a third discharging current $I_{E3}$ derived from the second discharging current $I_{E2}$ via a current image circuit $T_{2b}$, $T_{2c}$ discharge the second capacitor $C_2$, and by comparing the voltage at the second capacitor $C_2$ with a reference voltage $U_{REF}$ at a comparator K, said reference voltage being controlled directly by the control signal in its original, or noninverted, form, and by making the output $U_{out}$ produced at the output of the comparator and used for switching on the ignition coil primary current also discharge the second capacitor $C_2$.

The current multipliers each comprise two transistors $T_1$, $T_{1a}$ or $T_2$, $T_{2a}$ in each case of equal but opposite polarity to the transistors in the other current multiplier respectively, in which the emitter and the base electrodes of both transistors are connected together in each case in the current multipliers. As a result only one of the current multipliers conducts current at any one time.

The collector of the inverter transistor $T_{11}$ inverting the input signal $U_{in}$ is connected to the tap of a voltage divider $R_1$, $R_2$ and the resistor $R_1$ of the voltage divider which is common to the charging and discharging current branch of the first capacitor $C_1$ is connected to transistors $T_1$ and $T_2$ of the two current multipliers.

The second current $I_{L2}$ or $I_{E2}$ produced in the current multipliers and serving to increase the charging or discharging current flows through a transistor $T_{1b}$ or $T_{2b}$ of the current image circuit associated with the respective current multiplier so that a current derived from the second current flows in the second current branch of the respective current image circuit and charges or discharges the second capacitor $C_2$ arranged in this current branch. In the circuit in accordance with the invention, the two charging capacitors $C_1$ and $C_2$ contained in the circuit are charged or discharged in the same sense. The charging or discharging current of the first capacitor $C_1$ comprises the sum of two partial currents in each case and one of these partial currents passing through the connected image circuits forms a measure of the charging or discharging of the second capacitor $C_2$.

The collector/emitter path of a switching transistor $T_{14}$ controlled at its base by the output of the comparator K lies in parallel with the second capacitor $C_2$.

Considering the preferred embodiment in more detail, FIG. 1 shows an inverter transistor $T_{11}$ controlled at its base by the input signal $U_{in}$ via the resistors $R_{11}$, $R_{12}+R_{14}$.

The emitter of the transistor $T_{11}$ is connected to the supply voltage $U_B$ while the collector is connected to the tap of the voltage divider formed by resistors $R_1$ and $R_2$. The other end of the resistor $R_1$ is connected to the transistor $T_1$ of the first current multiplier. This current multiplier comprises the transistors $T_1$ and $T_{1a}$, of which the base and emitter electrodes are connected together in each case. With transistor $T_1$ the base/collector path is short circuited.

Furthermore the resistor $R_1$ is connected to the transistor $T_2$ of the second current multiplier which comprises transistors $T_2$ and $T_{2a}$ and the emitter electrodes are connected together in this case too, as are the base electrodes. The transistor $T_2$ is connected as a diode. The transistors of the first current multiplier have an opposite polarity to the transistors of the second current multiplier. All of the emitter electrodes of the transistors in the two current multipliers are connected to the capacitor $C_1$ so that the charging and discharging current paths of the capacitor $C_1$ pass through these current multipliers. The emitter/collector path of transistor $T_{1b}$, which in turn is part of one current image circuit comprising the transistors $T_{1b}$ and $T_{1c}$, lies in the collector path of the transistor $T_{1a}$ of the first current multiplier. Both transistors $T_{1b}$ and $T_{1c}$ of the current image circuit are connected together by their base electrodes and their emitter electrodes in each case. The transistor $T_{1b}$ is connected as a diode. The collector of the transistor $T_{1c}$ is connected to the second capacitor $C_2$. Correspondingly a transistor $T_{2b}$ of the second current image circuit lies in the collector path of transistor $T_{2a}$ of the second current multiplier. This second current image circuit comprises the transistors $T_{2b}$ and $T_{2c}$, and the base electrodes and the emitter electrodes of the two transistors are connected together. The transistor $T_{2b}$ is connected as a diode. The transistor $T_{2c}$ is connected by its collector to the second capacitor $C_2$. Since the transistors $T_{1c}$ and $T_{2c}$ have opposite polarity, the capacitor $C_2$ is charged via the transistor $T_{1c}$ and discharged via the transistor $T_{2c}$.

Figures 2A, 2B, 2C, 2D, 2E, 2F, 2G:
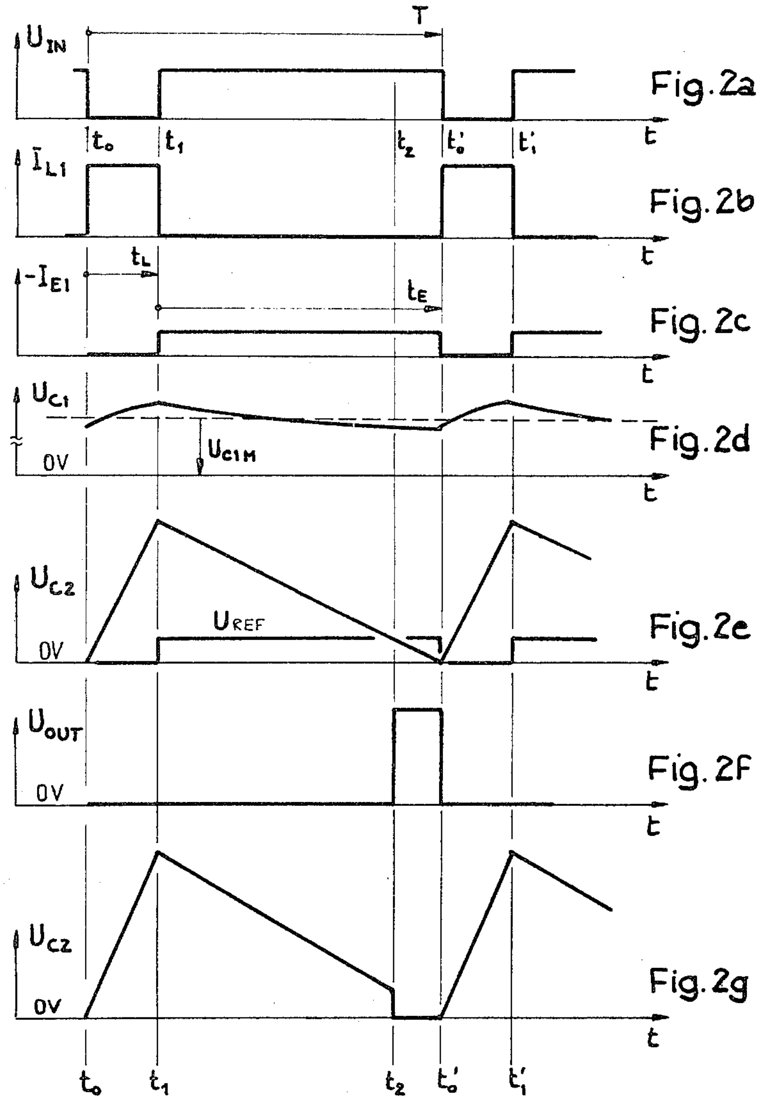

The cycle duration of the ignition cycle, i.e. the period of the pulse train constituting input signal $U_{in}$, can be seen from FIG. 2*a*. An output signal $U_{out}$ is delivered by the circuit in accordance with the invention and only appears shortly before the end of the period T, i.e. at the point in time $t_2$ (FIG. 2*f*), and serves to switch on the primary current of the ignition coil. At the end of the period T the signal $U_{out}$ is cut off and the high voltage for triggering the ignition spark is produced in the ignition system.

The input signal $U_{in}$, which is produced by a suitable generator and is controlled by the angular position of the crankshaft, lies at the input of the circuit. This signal is shown in FIG. 2*a*. A low level prevails at the input in the time from $t_0$–$t_1$ and, in the time from $t_1$ to the end of the cycle duration T, the potential floats at the input of the circuit. The input signal is inverted by the transistor $T_{11}$. When $U_{in}$ has a low level the transistor $T_{11}$ is conductive so that the potential $U_B$ of the supply voltage source is effectively present at the collector of the transistor $T_{11}$ and current is able to flow through the transistor $T_{11}$. When the potential is floating at the input of the circuit, the transistor $T_{11}$ is blocked and the discharge current of the capacitor $C_1$ is able to flow only through the voltage divider comprising the resistors $R_1$ and $R_2$ and the transistor $T_{2b}$ of the current image circuit.

With low potential at the input, the charging current $I_{L1}$ which is shown in FIG. 2*b* flows into the capacitor $C_1$ via the resistor $R_1$ and the transistor $T_1$. A further charging current component $I_{L2}$ is drawn through the transistor $T_{1a}$ so that the current flows into the capacitor $C_1$ increased or multiplied by the current $I_{L2}$ and charges up the said capacitor $C_1$. If the transistors $T_1$ and $T_{1a}$ have the same electrical data, then the charging current for the capacitor $C_1$ is $I_{C1L} \approx 2 \times I_{L1}$. Usually electrically the same data is provided for transistors $T_1$ and $T_{1a}$ due to the fact that the emitter areas of the transistors which are produced at the time are of equal size. By varying the geometry however, different multiplier ratios can be set.

The charging current component $I_{L2}$ is drawn through the transistor $T_{1b}$ of the first current image circuit, the transistor $T_{1b}$ being connected as a diode. Thus a charging current $I_{L3}$, which is in a defined ratio to the charging current $I_{L2}$, flows through the collector/emitter path of the transistor $T_{1c}$ too. If the transistors $T_{1b}$ and $T_{1c}$ have the same electrical data then: $I_{L2} \approx I_{L3}$. The current $I_{L3}$ charges the capacitor $C_2$ during the time $t_0$ to $t_1$ (FIG. 2*a*). The increasing voltage across the capacitor $C_2$ is shown in FIG. 2*e*.

During the time $t_1$ to $t_0'$, i.e. in the residual time of the period T, current is unable to flow through the transistor $T_{11}$ because of the floating potential at the input of the circuit. Consequently, as shown in FIG. 2*d*, the capacitor $C_1$ is discharged during the time $t_1$ to $t_0'$, through the transistor $T_2$ connected as a diode and the voltage divider $R_1$, $R_2$, as well as through the transistor $T_{2a}$ of the second current multiplier. The discharging current $I_{E1}$ through the transistor $T_2$ is shown in FIG. 2c. The discharging current component $I_{E2}$ flowing through the transistor $T_{2a}$ then corresponds to the current $I_{E1}$, if the two transistors $T_2$ and $T_{2a}$ have the same electrical data, i.e. have the same emitter dimensions in general. Then the discharge current of the capacitor $C_1$ is $I_{C1E} \approx 2 \times I_{E1}$. The current component $I_{E2}$ flows through the transistor $T_{2b}$ of the second current image circuit so that a current $I_{E3}$ derived from the transistor $I_{E2}$ by an image effect passes through the transistor $T_{2c}$ in the second current branch of this current image circuit, said transistor $T_{2c}$ conducting the discharge current of capacitor $C_2$. The capacitors $C_1$ and $C_2$ are discharged during the time $t_1$ to $t_0'$, in the same direction according to FIGS. 2d and 2e. If the time constant of the charging and discharging current circuit of the capacitor $C_1$, i.e. $C_1 \cdot R_1$ or $C_1 (R_1+R_2)$ is large as compared to the cycle duration T then an average dc voltage potential $U_{C1M}$ is set at the capacitor $C_1$ according to FIG. 2d. The following is true for this dc voltage $U_{C1M}$:

$$U_{C1M} = \frac{U_B + |U_{BE}|\,(A-1)}{1+A}$$

where $U_B$ is the potential of the feed voltage source, $|U_{BE}|$ is the absolute value of the base emitter voltage of the transistor $T_1$ and $$A = (t_E/t_L) \cdot (R_L/R_E)$$

where $t_E$ is the discharging time of the capacitor $C_1$, which corresponds to the time from $t_1$ to $t_0'$ according to FIG. 2c, $t_L$ is the charging time of the capacitor $C_1$ during the time from $t_0$ to $t_1$, $R_L$ is the value of the charging resistor $R_1$, and $R_E$ is the value of the discharging resistor $R_1+R_2$. With transistors of the same electrical data or the same geometry in the current image circuits, the charging current $I_{L3}$ of the capacitor $C_2$ corresponds to the current $I_{L2}$, and the discharging current $I_{E3}$ of the capacitor $C_2$ corresponds to the current $I_{E2}$. The voltages at the capacitor $C_1$ and $C_2$ therefore have a sawtooth shaped curve according to FIGS. 2d and 2e. Since the capacitor $C_1$ is set to an average dc voltage $U_{C1M}$ which is dependent on the duty ratio $t_E/t_L$, the following applies to the increase in voltage during the charging time:

$$\Delta U_{C1L} = (I_{C1L} \cdot t_L)/C_1$$

This increase in voltage must correspond to the drop in voltage during the discharge phase where the following is true:

$$\Delta U_{C1E} = (I_{C1E} \cdot t_E)/C_1$$

By solving the two equations the following relationship between the duty ratio and the currents flowing through $C_1$ is obtained:

$$I_{C1L} \cdot t_L = I_{C1E} \cdot t_E$$

Accordingly:

$$I_{C2L} \cdot t_L = I_{C2E} \cdot t_E$$

is also true.

The saw-tooth shaped voltage according to FIG. 2e at the capacitor $C_2$ is supplied to one input of a voltage comparator K. This voltage at the capacitor $C_2$ is compared with a reference voltage $U_{REF}$ by means of this comparator. The reference voltage $U_{REF}$ is supplied to the comparator in phase with the input signal $U_{in}$. This occurs via the transistors $T_{12}$ and $T_{13}$, which are controlled from the input connection. If the low level is applied to the input, the transistor $T_{12}$ is conductive, its base electrode being connected via the resistor $R_{13}$ to the connection point between the resistors $R_{12}$ and $R_{14}$. Consequently the transistor $T_{13}$ is conductive so that the reference potential is not applied to the second input of comparator K. If, on the other hand, the input connection is floating, then the transistor $T_{12}$ remains blocked as does the transistor $T_{13}$ which is connected thereafter so that the reference voltage $U_{REF}$ is fed to the comparator. This is apparent from FIG. 2e. An output signal $U_{out}$ only appears at the comparator output when the voltage $U_{C2}$ at the capacitor $C_2$ has fallen below the reference voltage $U_{REF}$. The output signal triggering the charging process of the ignition coil therefore only occurs in the time between $t_2$ and $t_0'$ according to FIG. 2f and this period is sufficient to supply the required ignition energy to the ignition coil. During the rest of the time, the primary coil remains without current so that optimum energy is saved. Due to the fact that the reference voltage $U_{REF}$ is supplied in a clock pulsed manner to the comparator K with the aid of the non-inverted input signal $U_{in}$, it is guaranteed that the reference voltage will occur at the comparator even if the capacitor $C_1$ is discharged when an ignition process is initiated. Therefore even when the engine is stationary and ignition is switched on unnecessary charging current is prevented from flowing through the primary coil.

The output signal $U_{out}$ at the comparator K is supplied back via the resistor $R_{16}$ and the transistor $T_{14}$ to the comparator input for the voltage $U_{C2}$. The transistor $T_{14}$ is made conductive when there is an output signal $U_{out}$ at the comparator K and discharges the parallel-connected capacitor $C_2$ so that at the beginning of a new ignition cycle, zero potential always prevails at the capacitor $C_2$. As a result, the voltage at the capacitor $C_2$ is prevented from rising. The resultant voltage curve at the capacitor $C_2$ is shown in FIG. 2g.

The curve paths shown in FIGS. 2a to 2g vary with the speed of the engine or the distributor. As the speed increases, the cycle times are shortened and the maximum voltage potentials at the capacitors $C_1$ and $C_2$ are reduced. This means that as the speed increases the output pulse $U_{out}$ includes an ever-greater proportion of the time between $t_1$ and $t_0'$. At very high speed the duration of the output pulse $U_{out}$ will correspond to the period of time between $t_1$ and $t_0'$ while at very low speeds the output pulse $U_{out}$ only has a small time component if measured against the overall cycle time T.

Therefore at low and medium speeds the current flow in the primary coil is restricted in terms of time with the aid of the circuit in accordance with the invention and therefore energy is saved.

It will be understood that the above description of the present invention is susceptible to various modifications changes and adaptations.

What is claimed is:

1. An input stage for an ignition control circuit for generating a cyclic output signal in response to a cyclic control signal composed of a train of pulses supplied to said input stage, the output signal serving for switching on and off the current to the primary winding of an ignition coil, said input stage comprising:

an inverter connected to receive the control signal for producing an inverter output signal which is an inverted version of the control signal;

a first current multiplier for producing first and second charging currents;

a second current multiplier for producing first and second discharging currents;

said first and second current multipliers being connected to said inverter to be controlled by the inverter output signal in a manner such that the charging currents are produced in alternation with the discharging currents at the repetition rate of the cyclic control signal;

means defining a charging resistance having a selected value and a discharging resistance having a selected value connected to said first and second current multipliers for causing the amplitude of the first charging current to be determined by the value of the charging resistance and the amplitude of the first discharging current to be determined by the value of the discharging resistance;

a first capacitor connected to said first and second current multipliers to be charged by the first and second charging currents and discharged by the first and second discharging currents;

a first current mirror circuit connected to said first current multiplier for producing a third charging current derived from, and in time coincidence with, the second charging current;

a second current mirror circuit connected to said second current multiplier for producing a third discharging current derived from, and in time coincidence with, the second discharging current;

a second capacitor connected to said first and second mirror circuits to be charged by the third charging current simultaneously with the charging of said first capacitor and to be discharged by the third discharging current simultaneously with the discharging of said first capacitor;

means connected to receive the control signal for periodically producing a reference voltage at the repetition rate of the control signal;

a comparator having inputs connected to receive the voltage across said second capacitor and the reference voltage, and having an output providing the cyclic output signal as a function of the relation between the voltages at its said inputs; and means connected between said comparator output and said second capacitor for effecting discharging of said second capacitor under control of the output signal.

2. An input stage as defined in claim 1, wherein said two current multipliers each comprise two transistors of equal but opposite polarity to the transistors in the other current multiplier respectively, and the emitter and base electrodes of both transistors in each said current multiplier are connected together.

3. An input stage as defined in claim 2, wherein said means defining a charging resistance and a discharging resistance comprise a voltage divider with one resistor connected to conduct the charging and discharging currents of said first capacitor and connected to one transistor of each of said two current multipliers, and said inverter comprises a transistor having its collector connected to a tap of said voltage divider.

4. An input stage as defined in claim 1, wherein each said current mirror circuit comprises a transistor conducting the second current produced in a respective one of said current multipliers, and means defining a second current branch providing the respective third current.

5. An input stage as defined in claim 1 wherein said means for effecting discharging comprises a switching transistor having its collector-emitter path connected in parallel with said second capacitor and controlled by the voltage at its base, and having its base connected to receive a voltage derived from the signal at said output of said comparator.

6. An input stage for generating a cyclic output signal in response to a cyclic control signal composed of a train of pulses supplied to said input stage, said input stage comprising:

an inverter connected to receive the control signal for producing an inverter output signal which is an inverted version of the control signal;

a first current multiplier for producing first and second charging currents;

a second current multiplier for producing first and second discharging currents;

said first and second current multipliers being connected to said inverter to be controlled by the inverter output signal in a manner such that the charging currents and produced in alternation with the discharging currents at the repetition rate of the cyclic control signal;

means defining a charging resistance having a selected value and a discharging resistance having a selected value connected to said first and second current multipliers for causing the amplitude of the first charging current to be determined by the value of the charging resistance and the amplitude of the first discharging current to be determined by the value of the discharging resistance;

a first capacitor connected to said first and second current multipliers to be charged by the first and second charging currents and discharged by the first and second discharging currents;

a first current mirror circuit connected to said first current multiplier for producing a third charging current derived from, and in time coincidence with, the second charging current;

a second current mirror circuit connected to said second current multiplier for producing a third discharging current derived from, and in time coincidence with, the second discharging current;

a second capacitor connected to said first and second mirror circuits to be charged by the third charging current simultaneously with the charging of said first capacitor and to be discharged by the third discharging current simultaneously with the discharging of said first capacitor;

means connected to receive the control signal for periodically producing a reference voltage at the repetition rate of the control signal;

a comparator having inputs connected to receive the voltage across said second capacitor and the reference voltage, and having an output providing the cyclic output signal as a function of the relation between the voltages at its said inputs; and means connected between said comparator output and said second capacitor for effecting discharging of said second capacitor under control of the output signal.

* * * * *